(12) United States Patent
Matsuoka et al.

(10) Patent No.: US 8,884,362 B2
(45) Date of Patent: Nov. 11, 2014

(54) SEMICONDUCTOR DEVICE AND MANUFACTURING METHOD OF THE SAME

(75) Inventors: Takeru Matsuoka, Hyogo-ken (JP);
Nobuyuki Sato, Hyogo-ken (JP);
Shigeaki Hayase, Hyogo-ken (JP);
Kentaro Ichinoseki, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 13/614,791

(22) Filed: Sep. 13, 2012

(65) Prior Publication Data

US 2013/0069150 A1 Mar. 21, 2013

(30) Foreign Application Priority Data

Sep. 20, 2011 (JP) ................................. 2011-204530

(51) Int. Cl.

| H01L 29/78 | (2006.01) |
| H01L 21/336 | (2006.01) |
| H01L 29/40 | (2006.01) |
| H01L 29/66 | (2006.01) |
| H01L 29/423 | (2006.01) |
| H01L 29/417 | (2006.01) |

(52) U.S. Cl.
CPC ......... *H01L 29/407* (2013.01); *H01L 29/42368* (2013.01); *H01L 29/42376* (2013.01); *H01L 29/7813* (2013.01); *H01L 29/41766* (2013.01); *H01L 29/66734* (2013.01)
USPC ................... 257/330; 438/270; 257/E29.262; 257/E21.41

(58) Field of Classification Search
USPC ................. 257/300–302, 328–331, 335–339, 257/341–345, 500–502; 438/270
See application file for complete search history.

(56) References Cited

U.S. PATENT DOCUMENTS

| 2005/0215010 A1 | 9/2005 | Henninger et al. | |
| 2006/0145230 A1* | 7/2006 | Omura et al. | 257/302 |
| 2009/0206395 A1* | 8/2009 | Hshieh | 257/328 |
| 2010/0052044 A1 | 3/2010 | Hirler et al. | |
| 2011/0136310 A1* | 6/2011 | Grivna | 438/270 |
| 2011/0156140 A1 | 6/2011 | Zara | |

FOREIGN PATENT DOCUMENTS

| JP | 04-234166 | 8/1992 |
| JP | 9-503626 | 4/1997 |
| JP | 2004-253576 | 9/2004 |
| JP | 2010-062557 | 3/2010 |

OTHER PUBLICATIONS

Korean Office Action dated Oct. 29, 2013, filed in Japanese counterpart Application No. 10-2012-0095728, 10 pages (with translation).

* cited by examiner

*Primary Examiner* — Fernando L Toledo
*Assistant Examiner* — Lawrence-Linh T Nguyen
(74) *Attorney, Agent, or Firm* — Patterson & Sheridan, LLP

(57) ABSTRACT

According to one embodiment, a semiconductor device includes a semiconductor layer; a plurality of semiconductor regions; second semiconductor region; a first electrode being positioned between the plurality of first semiconductor regions, the first electrode contacting with the semiconductor layer, each of the plurality of first semiconductor regions, and the second semiconductor region via a first insulating film; a second electrode provided below the first electrode, and contacting with the semiconductor layer via a second insulating film; an insulating layer interposed between the first electrode and the second electrode; a third electrode electrically connected to the semiconductor layer; and a fourth electrode connected to the second semiconductor region. The first electrode has a first portion and a pair of second portions. And each of the pair of second portions is provided along the first insulating film.

21 Claims, 11 Drawing Sheets

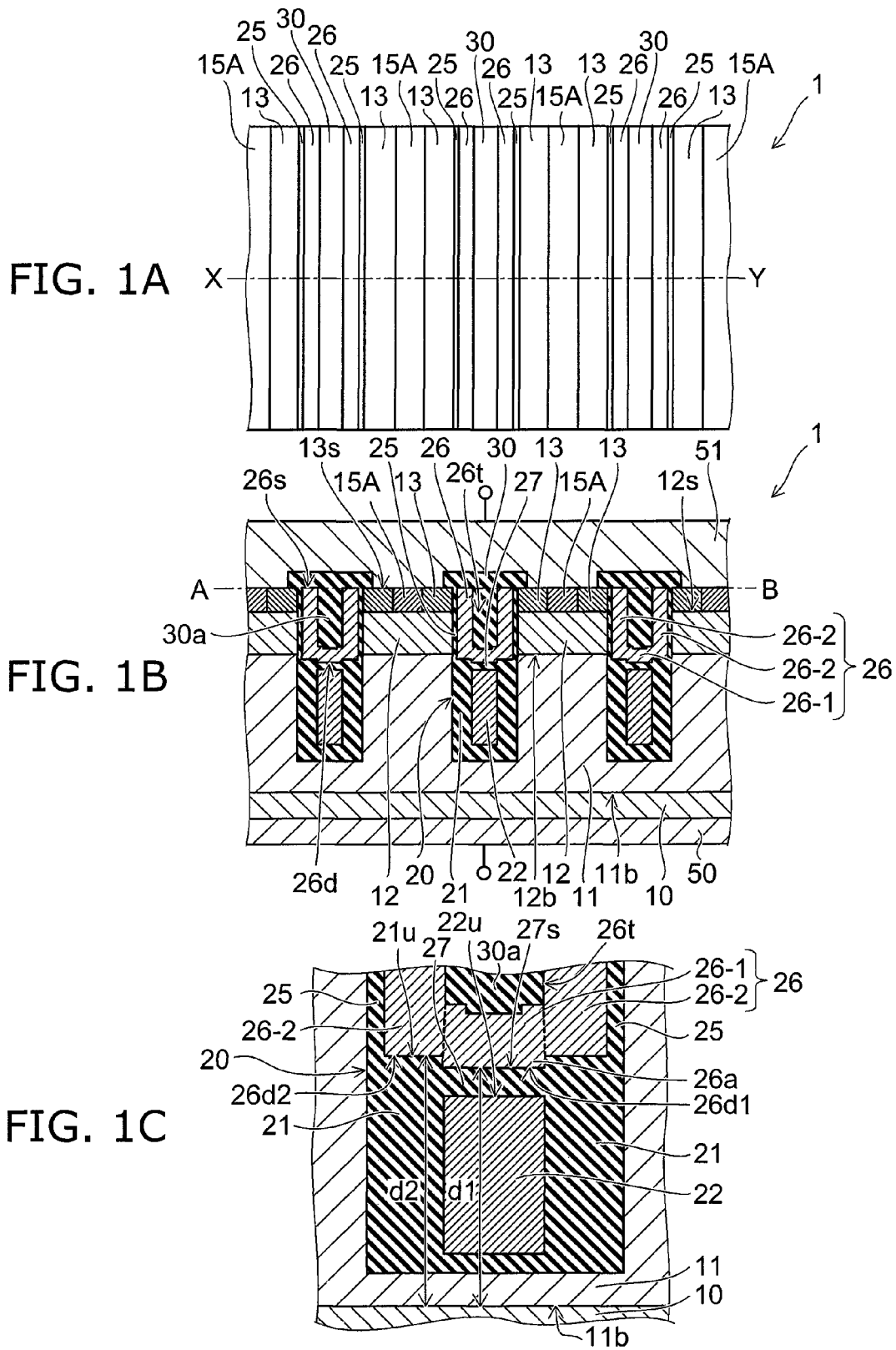

US 8,884,362 B2

SEMICONDUCTOR DEVICE AND MANUFACTURING METHOD OF THE SAME

CROSS-REFERENCE TO RELATED APPLICATIONS

This application is based upon and claims the benefit of priority from Japanese Patent Application No. 2011-204530, filed on Sep. 20, 2011; the entire contents of which are incorporated herein by reference.

FIELD

Embodiments described herein relate generally to a semiconductor device and a manufacturing method of the same.

BACKGROUND

A power metal oxide semiconductor field effect transistor (MOSFET) of a vertical electrode configuration is embedded in a switching power supply having a great current and a high breakdown voltage. In addition, in this kind of element, an intended use as a switching element of a mobile communication equipment, which is a note type personal computer for example, is rapidly increased. In the mobile communication equipment or the like, a synchronous rectifying circuit represented by an AC-DC converter, and a DC-DC converter are embedded.

In order to use as the switching element of the mobile communication equipment or the like, it is desirable that this kind of element saves energy. In order to realize the energy saving, it is one means that this kind of element is set to lower on resistance.

For example, in a method of achieving the low on resistance, a method of setting a field plate electrode below a gate electrode has been paid attention. By setting the field plate electrode below the gate electrode, a depletion of a drift layer is promoted, and it is possible to increase a concentration of impurities in the drift layer. Accordingly, the low on resistance of this kind of element is realized. Further, in order to make this kind of element come to a further energy saving, a low switching loss is demanded in addition to the low on resistance.

BRIEF DESCRIPTION OF THE DRAWINGS

FIGS. 1A to 1C are schematic views of a semiconductor device according to a first embodiment.

DETAILED DESCRIPTION

Figure 2A:
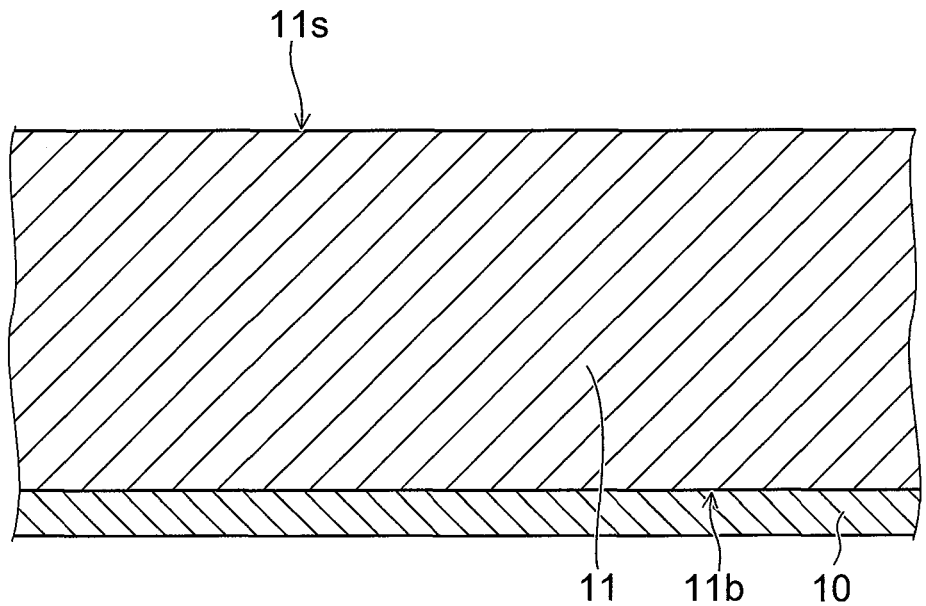
FIGS. 2A to 7B are cross-sectional schematic views for describing the manufacturing process of the semiconductor device according to the first embodiment.

In general, according to one embodiment, a semiconductor device includes a first conductive type semiconductor layer; a plurality of second conductive type first semiconductor regions provided on the semiconductor layer; a first conductive type second semiconductor region provided on each of the plurality of first semiconductor regions. And the semiconductor device includes a first electrode being positioned between the plurality of first semiconductor regions, the first electrode contacting with the semiconductor layer, each of the plurality of first semiconductor regions, and the second semiconductor region via a first insulating film; a second electrode provided below the first electrode, and contacting with the semiconductor layer via a second insulating film; an insulating layer interposed between the first electrode and the second electrode; a third electrode electrically connected to the semiconductor layer; and a fourth electrode connected to the second semiconductor region. The first electrode has a first portion facing an upper end of the second electrode; and a pair of second portions connected to the first portion, the pair of second portions being extended from the semiconductor layer toward the second semiconductor region, and the pair of second portions facing each other. And each of the pair of second portions is provided along the first insulating film.

A description will be given below of an embodiment with reference to the accompanying drawings. In the following description, the same reference numerals are attached to the same members, and a description of the members which have been once described will not be appropriately repeated.

(First Embodiment)

FIGS. 1A to 1C are schematic views of a semiconductor device according to a first embodiment, in which FIG. 1A is a plan schematic view, FIG. 1B is a cross-sectional schematic view of a position which is along a line X-Y in FIG. 1A, and FIG. 1C is an enlarged view of a periphery of a lower end of a gate electrode. FIG. 1A shows a state in which a cross section along a line A-B in FIG. 1B is seen from the above.

A semiconductor device 1 is a MOSFET which includes a vertical electrode configuration.

The semiconductor device 1 includes an n⁻ type drift layer (a semiconductor layer) 11, a plurality of p type base regions (first semiconductor regions) 12 which are provided on the drift layer 11, an n⁺ type source region (a second semiconductor region) 13 which is provided on each of a plurality of base regions 12, and a p⁺ type contact region (a third semiconductor region) 15A which is provided on each of a plurality of base regions 12.

For example, the n⁻ type drift layer 11 is provided on a n⁺ type drain layer 10. The p type base region 12 is selectively provided on an upper side of the drift layer 11. The n⁺ type source region 13 is selectively provided in a surface (an upper face) 12s of the base region 12. Further, the p⁺ type contact region 15A which is a hole removing region is selectively provided in a surface 12s of the base region 12. The source region 13 contacts with the contact region 15A.

The semiconductor device 1 includes a gate electrode (a first electrode) 26, and a field plate electrode (a second electrode) 22. The gate electrode 26 is positioned between a plurality of base regions 12. The gate electrode 26 contacts with the drift layer 11, each of a plurality of base regions 12, and the source region 13, via a gate insulating film (a first insulating film) 25. The field plate electrode 22 is provided below the gate electrode 26, and contacts with the drift layer 11 via a field plate insulating film (a second insulating film) 21.

For example, after a trench 20 which passes through the base region 12 from a surface 13s of the source region 13 and reaches the drift layer 11 is formed, the field plate electrode 22 and the gate electrode 26 are provided within the trench 20. The formation of the trench 20 will be mentioned later. For example, the field plate electrode 22 is extended in the direction from the drift layer 11 toward the drain layer 10 via the field plate insulating film 21 within the trench 20. An upper end 21u of the field plate insulating film 21 is positioned on an upper side of an upper end 22u of the field plate electrode 22. The upper end 22u of the field plate electrode 22 is lower than a lower end 12b (also called as a lower face 12b, or a boundary 12b, or a back surface 12b, or a bottom 12b) of the base region 12. On the basis of an existence of the field plate electrode 22, a depletion of the drift layer 11 is promoted even if a concentration of impurities of the drift layer 11 is increased. As a result, in the semiconductor device 1, a high breakdown voltage and a low on resistance are realized.

Further, within the trench 20, a gate electrode 26 is provided via the gate insulating film 25, on an upper side of the field plate electrode 22. A surface 26s of the gate electrode 26 is higher than the surface 12s of the base region 12. A lower end 26d of the gate electrode 26 is lower than the lower end 12b of the base region 12. An insulating layer 27 is interposed between the gate electrode 26 and the field plate electrode 22. A thickness of the field plate insulating film 21 in a direction in which a plurality of base regions 12 are arranged side by side on the drift layer 11 is thicker than a thickness of the gate insulating film 25 in a direction in which a plurality of base regions 12 are arranged side by side on the drift layer 11 and thicker than a thickness of the insulating layer 27.

In the semiconductor device 1, the gate electrode 26 is not completely buried in the trench 20. The gate electrode 26 includes a trench 26t from a side of the surface 26s of the gate electrode 26 toward the back surface 11b of the drift layer 11. For example, in a cross-sectional schematic view in FIG. 1B, the gate electrode 26 comes to a shape which is like an alphabet "U" shape. An interlayer insulating film 30 is provided on a part of the source region 13, on the gate electrode 26, and within the trench 26t. The interlayer insulating film 30 is buried in the trench 26t of the gate electrode 26.

In the semiconductor device 1, a projection portion 26a is provided in a lower portion of the gate electrode 26. The projection portion 26a protrudes to a side of the field plate electrode 22 (refer to FIG. 1C). An insulating layer 27 is interposed between the projection portion 26a of the gate electrode 26 and the field plate electrode 22.

The gate electrode 26 has a first portion 26-1 which is facing the upper end 22u of the field plate electrode 22, and a pair of second portions 26-2 which are connected to the first portion 26-1. A pair of second portions 26-2 are extended in the direction from the drift layer 11 toward the base region 12, and are facing each other. Each of a pair of second portions 26-2 is provided along the gate insulating film 25.

A distance d1 between a lower end 26d1 of the first portion 26-1 and the back surface 11b of the drift layer 11 is shorter than a distance d2 between a lower end 26d2 of the second portion 26-2 and the back surface 11b of the drift layer 11.

In the back surface 11b side of the drift layer 11, a drain electrode (a third electrode) 50 is electrically connected to the drift layer 11. A source electrode (a fourth electrode) 51 is connected to the source region 13 and the contact region 15A. The field plate electrode 22 is electrically connected to the source electrode 51.

In this case, the interlayer insulating film 30 is provided between the source electrode 13 and the gate electrode 26. A part 30a of the interlayer insulating film 30 is positioned on a lower side of the upper end (the surface 26s) of the gate electrode 26. The part 30a of the interlayer insulating film 30 is surrounded by the gate electrode 26. The part 30a of the interlayer insulating film 30 is sandwiched between a pair of second portion 26-2 of the gate electrode 26.

In the embodiment, the n type (including the $n^+$ type and the $n^-$ type) may be called as a first conductive type, and the p type (including the $p^+$ type and the $p^-$ type) may be called as a second conductive type. Examples of the impurity of the first conductive type include, for example, an arsenic (As), a phosphorous (P) and the like. Examples of the impurity of the second conductive type include, for example, a boron (B) and a boron fluoride ($BF_2^+$) and the like.

Further, in the embodiment, since the field plate electrode 22 is a conductive layer, and is electrically connected to the source electrode 51, the field plate electrode 22 may be called simply as "source electrode".

A main component of the drain layer 10, the drift layer 11, the base region 12, the source region 13 and the contact region 15A is, for example, a silicon (Si). A material of the field plate electrode 22 and the gate electrode 26 is, for example, a polysilicon (polycrystalline silicon) including the first conductive type impurities, an amorphous silicon or the like. A material of the field plate insulating film 21, the gate insulating film 25, the insulating layer 27 and the interlayer insulating film 30 is, for example, a silicon oxide ($SiO_2$).

A description will be given of a manufacturing process of the semiconductor device 1.

FIGS. 2A to 7B are cross-sectional schematic views for describing the manufacturing process of the semiconductor device according to the first embodiment.

As shown in FIG. 2A, after preparing the drain layer 10 which is a semiconductor substrate, the drift layer 11 is formed on the drain layer 10 by an epitaxial growth. Alternatively, a wafer shaped semiconductor stacked body, in which the drift layer 11 is formed on the drain layer 10, may be prepared.

Figure 2B:
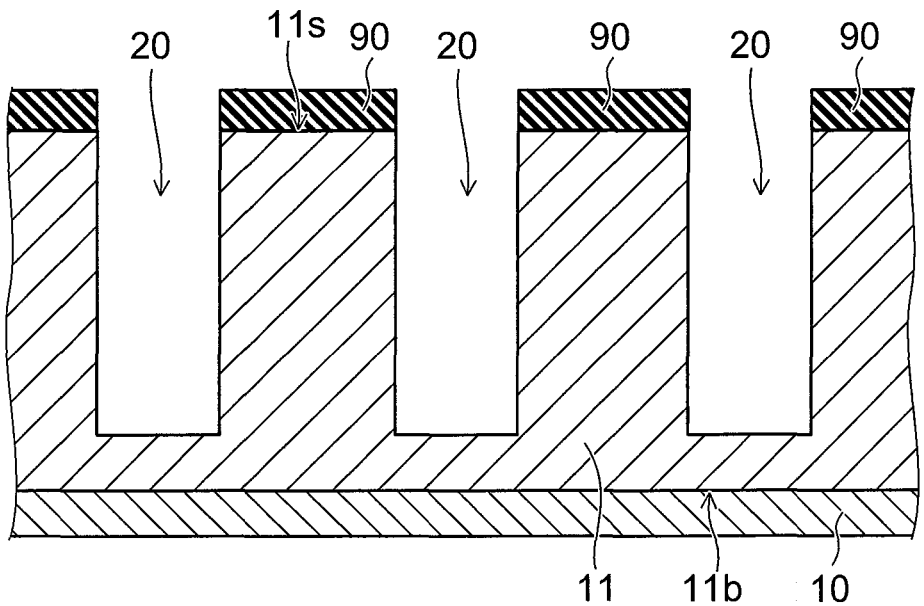

Next, as shown in FIG. 2B, the trench 20 (a first trench) is selectively formed on the drift layer 11, in the direction from the surface 11s of the drift layer 11 toward the back surface 11b of the drift layer 11. For example, a mask 90 which selectively opens the surface 11s of the drift layer 11 is formed on the drift 11 by a photolithography technique, or a reactive ion etching (RIE). A material of the mask 90 is an oxide (for example, a silicon oxide). Subsequently, the reactive ion etching is applied to the surface 11s of the drift layer 11 which is opened from the mask 90. Accordingly, the trench 20 is selectively formed on the trench 20 from the surface 11s of the drift layer 11 toward the back surface 11b of the drift layer 11.

Figure 3A:
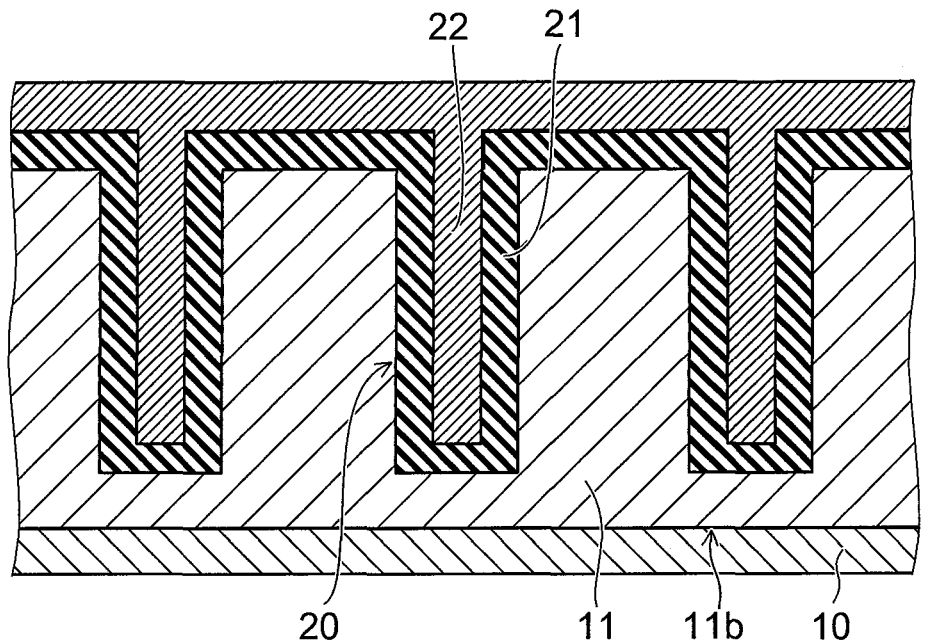

Next, as shown in FIG. 3A, the field plate insulating film 21 is formed on an inner wall of the trench 20. Subsequently, the field plate electrode 22 is formed via the field plate insulating film 21 within the trench 20. The field plate insulating film 21 is formed, for example, by a thermal oxidation method or a chemical vapor deposition (CVD) or the like. Thereafter, the field plate electrode 22 is formed by the CVD or the like.

In the embodiment, the n type impurities may be diffused into the field plate electrode 22. For example, after forming the field plate electrode 22 which includes a non-doped polysilicon or the amorphous silicon, a phosphorous oxychloride ($POCl_3$) atmosphere is exposed to the field plate electrode 22, and a phosphorous (P) is thermally diffused into the field plate electrode 22. Alternatively, a phosphine ($PH_3$) or the like may be mixed into a silane ($SiH_4$) or the like which is a raw material of the CVD, and the phosphorous (P) may be diffused into the field plate electrode 22 while maintaining a decompressed state in the CVD.

Figure 3B:
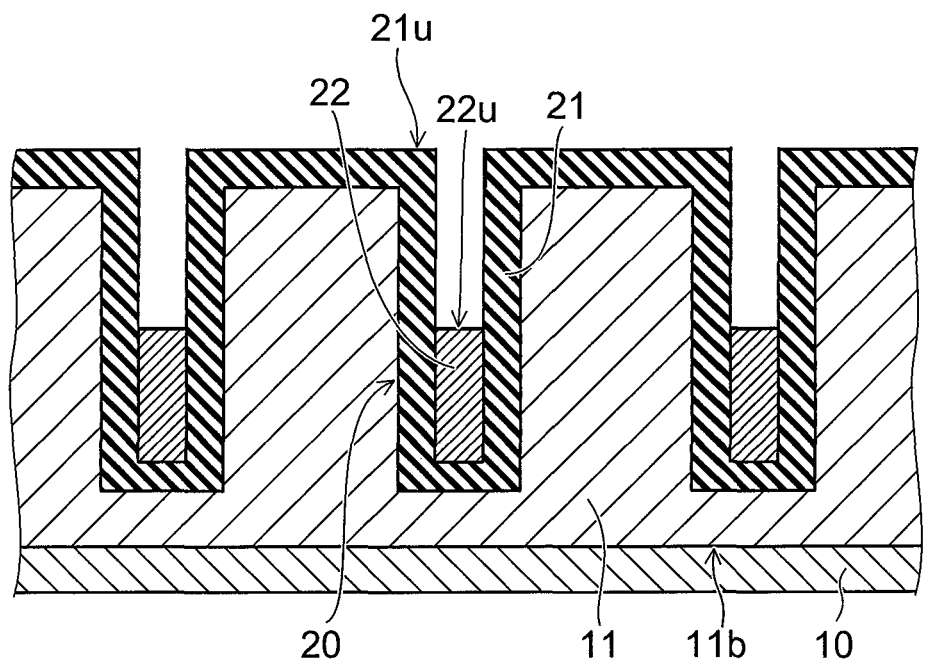

Next, as shown in FIG. 3B, the upper end 22u of the field plate electrode 22 is etched back by a chemical dry etching.

Accordingly, the upper end 22u of the field plate electrode 22 is lowered to the side of the back surface 11b of the drift layer 11.

In a process mentioned later, the field plate insulating film 21 is etched back from a state in FIG. 3B. In a stage in FIG. 3B, the upper end 22u of the field plate electrode 22 is adjusted in such a manner as to become lower than the upper end 21u of the field plate insulating film 21 after being etched back.

Figure 4A:
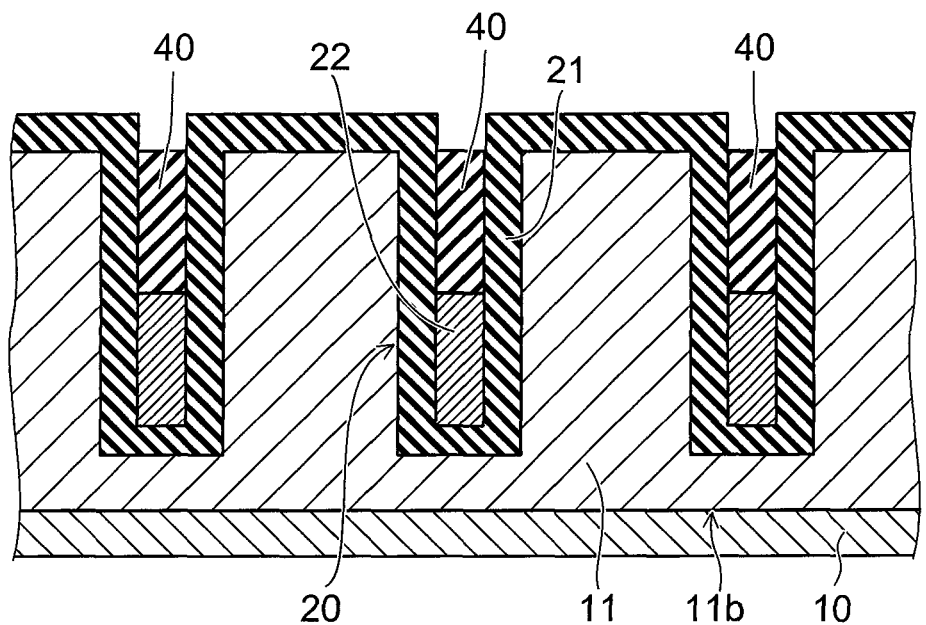

Next, as shown in FIG. 4A, a sacrifice layer 40 is formed on the field plate electrode 22. A material of the sacrifice layer 40 is an organic resist. As a material of the sacrifice layer 40, a material having a high resistance against a wet etchant (for example, a water solution of a hydrogen fluoride) for an oxide film is selected. The sacrifice layer 40 may be formed by a photolithography or the like, or may be formed by a coating method or the like and an etch back.

Figure 4B:
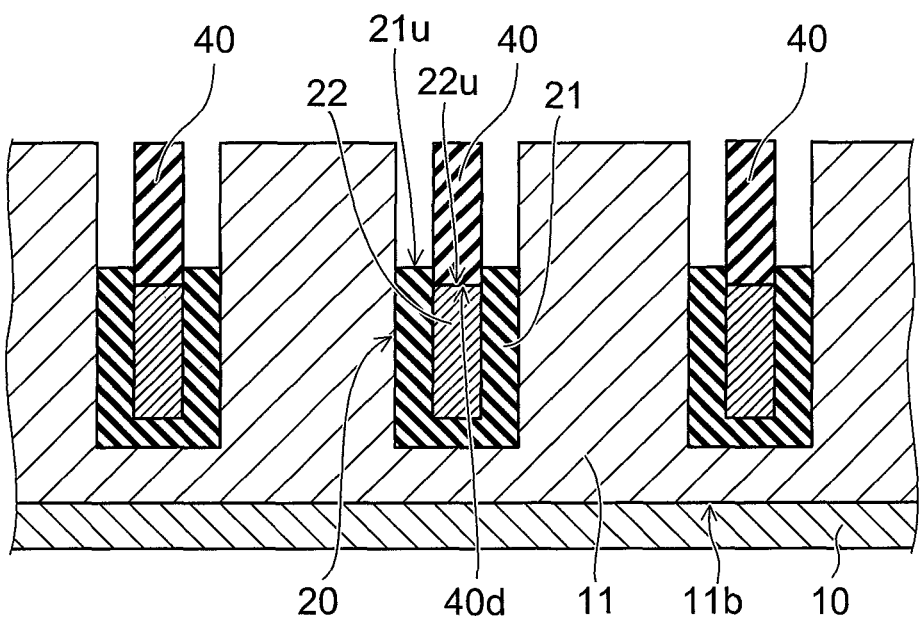

Next, as shown in FIG. 4B, the upper end 21u of the field plate insulating film 21 is etched back in such a manner as to prevent the upper end 21u of the field plate insulating film 21 from becoming lower than a lower end 40d of the sacrifice layer 40. That is, the upper end of 21u the field plate insulating film 21 is etched back so as not to lower the upper end 21u of the field plate insulating film 21 lower than the lower end 40d of the sacrifice layer 40.

For example, the upper end 21u of the field plate insulating film 21 is etched back by the wet etchant of the HF water solution, by using the sacrifice layer 40 as a mask. In this etch back, the upper end 21u of the field plate insulating film 21 is adjusted in such a manner as to become higher than the upper end 22u of the field plate electrode 22.

If an etching speed is too fast, there is a case that the upper ends 21u of a part of the field plate insulating films 21 become lower than the upper end 22u of the field plate electrode 22, due to a dispersion of the etching speed. In the embodiment, in order to suppress this phenomenon, it is possible to use a wet etching solution in which the etching speed becomes slow. Thereafter, the sacrifice layer 40 is removed by an ashing or an organic solvent.

Figure 5A:
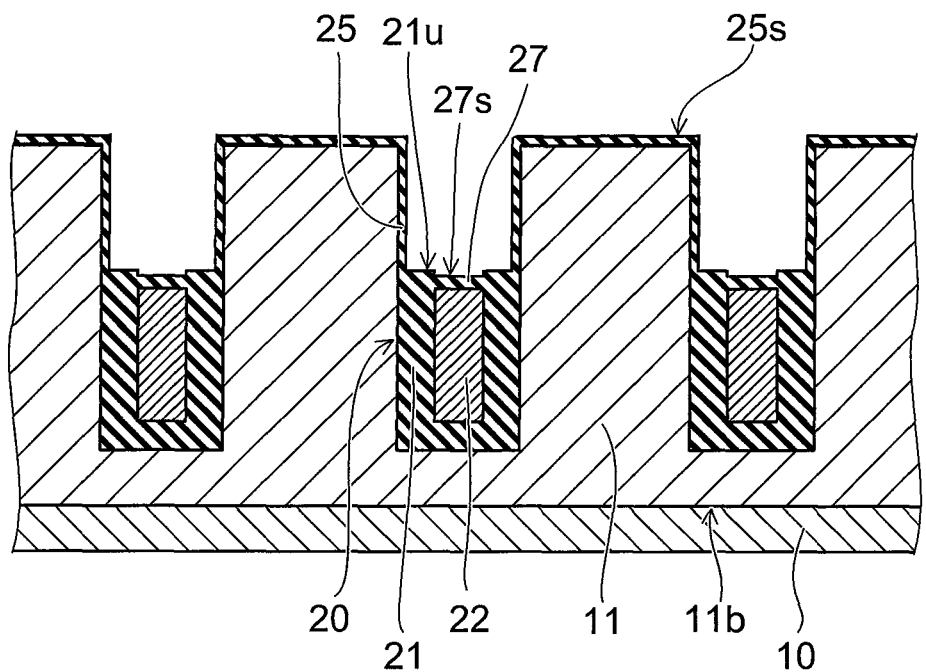

Next, as shown in FIG. 5A, the insulating layer 27 is formed on the field plate electrode 22, and the gate insulating film 25 is formed in the inner wall of the trench 20 on the upper side of the field plate insulating film 21. The insulating layer 27 and the gate insulating film 25 are formed by a thermal oxidation method. The insulating layer 27 and the gate insulating film 25 may be formed simultaneously.

In this stage, since the thickness of the insulating layer 27 is adjusted in such a manner as to become thinner than the thickness of the field plate insulating film 21, the upper end 21u of the field plate insulating film 21 becomes higher than the surface 27s of the insulating layer 27. That is, a step is generated between the surface 27s of the insulating layer 27 and the upper end 21u of the field plate insulating film 21.

Figure 5B:
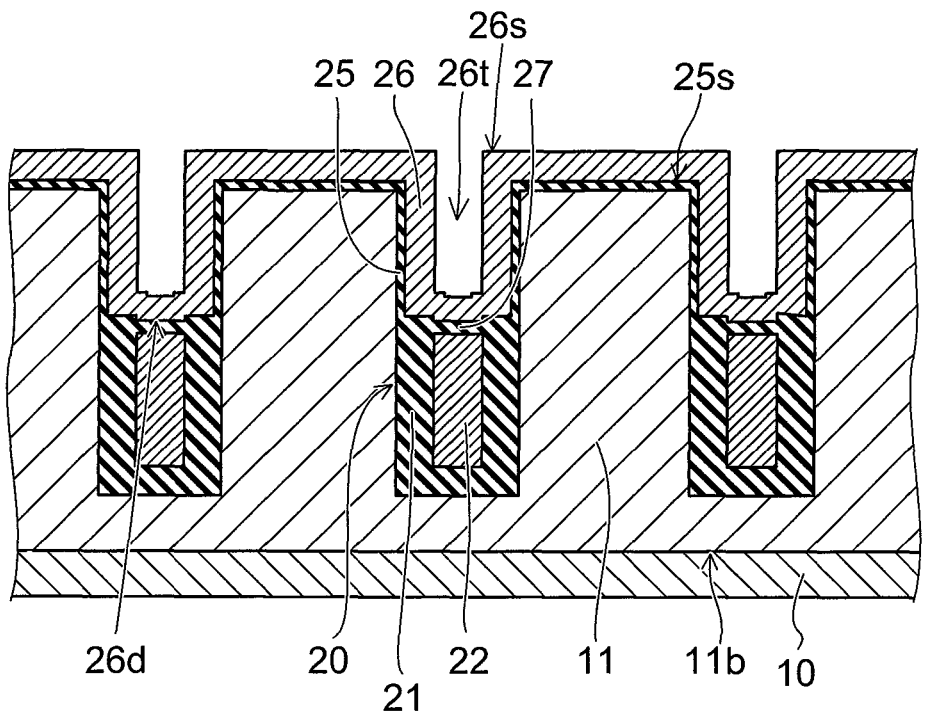

Next, as shown in FIG. 5B, the gate electrode 26 is formed on the insulating layer 27 and on the gate insulating film 25. The gate electrode 26 is formed by the CVD or the like.

In the embodiment, the n type impurities may be thermally diffused into the gate electrode 26. For example, after forming the gate electrode 26 which includes the non-doped polysilicon or the amorphous silicon, the phosphorous oxychloride ($POCl_3$) atmosphere is exposed to the gate electrode 26, and the phosphorous (P) is thermally diffused into the gate electrode 26. Alternatively, the phosphine ($PH_3$) or the like may be mixed into the silane ($SiH_4$) or the like which is the raw material of the CVD, and the phosphorous (P) may be diffused into the gate electrode 26 while maintaining the decompressed state in the CVD.

In the embodiment, in a process of forming the gate electrode 26, the gate electrode is not completely buried via the gate insulating film 25 within the trench 20. Accordingly, a trench 26t (a second trench) is formed in the gate electrode 26 in the direction from the surface 26s side of the gate electrode 26 toward the back surface 11b side of the drift layer 11.

Since the gate electrode 26 is formed on the surface 27s of the insulating layer 27 and the upper end 21u of the field plate insulating film 21, the projection portion 26a shown in FIG. 1C is formed.

Figure 6A:
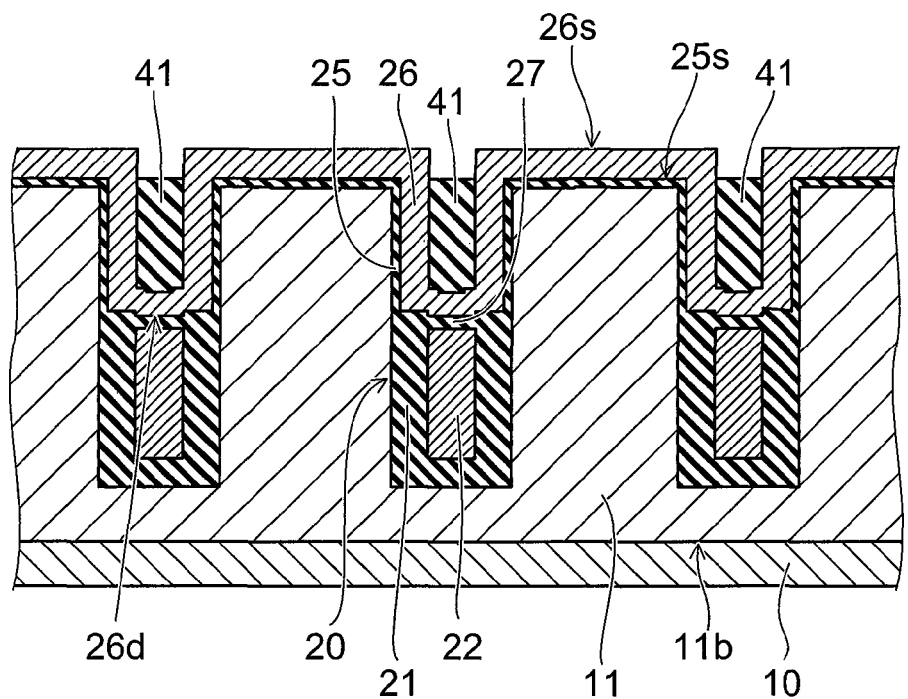

Next, as shown in FIG. 6A, a sacrifice layer 41 is formed within the trench 26t of the gate electrode 26. A material of the sacrifice layer 41 is an organic resist or an oxide (for example, a silicon oxide). As a material of the sacrifice layer 41, a material having a high resistance against a wet etchant (for example, a water solution of a hydrofluoric acid, an alkali water solution or the like) or a dry etchant (for example, a hydrofluoric acid gas, an alkali gas or the like) for a semiconductor layer is selected. The sacrifice layer 41 may be formed by a photolithography or the like in the case of the organic resist, or may be formed by etch back after forming a film by a CVD method or a coating method or the like in the case of the oxide.

Figure 6B:
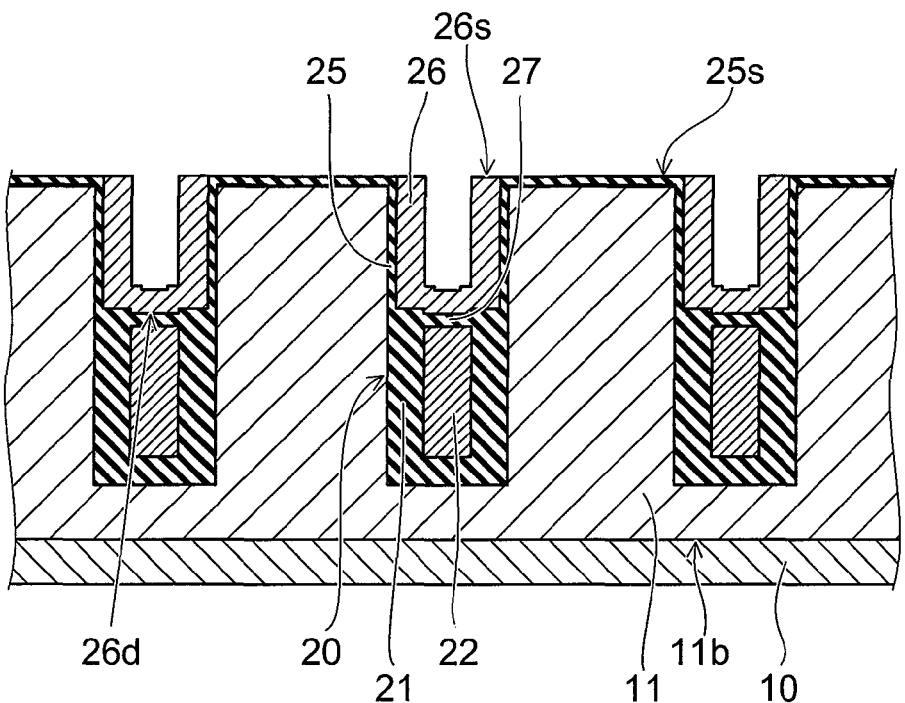

Next, as shown in FIG. 6B, a surplus portion of the gate electrode 26 is etched to make a height of the surface 25s of the gate insulating film 25, which is formed on the drift layer 11, approximately equal to a height of the surface 26s of the gate electrode 26. The surplus portion of the gate electrode 26 may be removed by a chemical mechanical polishing (CMP) in addition to the etching. Thereafter, the sacrifice layer 41 is removed by the ashing or the organic solvent. In the case that the material of the sacrifice layer 41 is the oxide, it is possible to carry out the next process without removing the sacrifice layer 41.

Figure 7A:
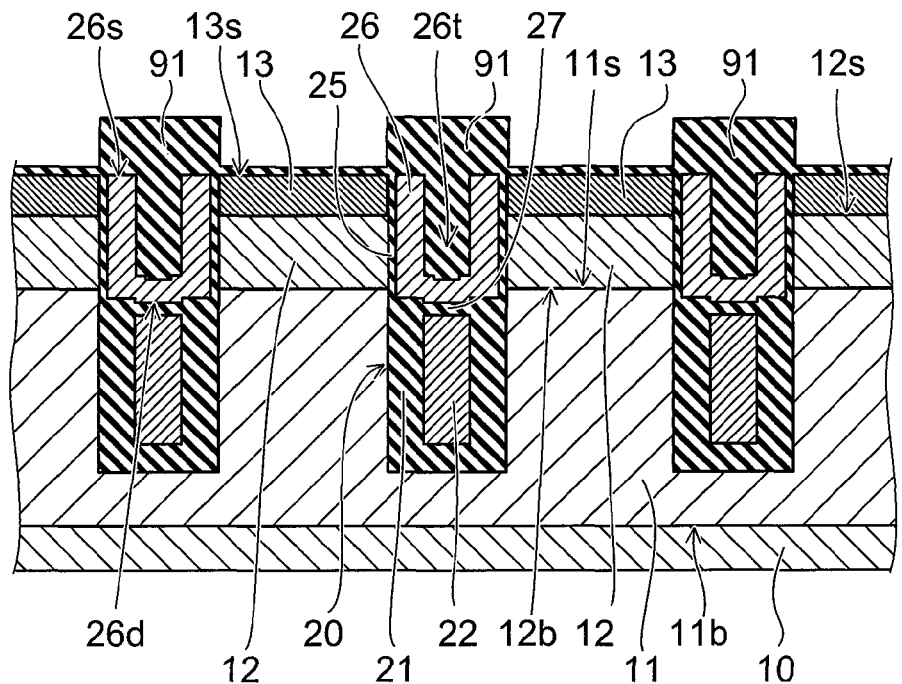

Next, as shown in FIG. 7A, the base region 12 is formed on the surface 11s of the drift layer 11 after forming a mask 91 which selectively covers the gate insulating film 25 which is sandwiched between the semiconductor layer and the gate electrode 26, and the gate electrode 26. The material of the mask 91 is the oxide (for example, the silicon oxide). Further, the source region 13 is formed on the surface 12s of the base region 12.

At a time of forming the base region 12 on the surface 11s of the drift layer 11 or forming the source region 13 on the surface 12s of the base region 12, a so-called counter ion injecting method is used.

For example, a p type impurity ($B^+$, $BF_2^+$ or the like) having a concentration higher than a concentration of the n type impurity in the drift layer 11 is injected into the surface 11s of the drift layer 11 from the surface 11s of the drift layer 11 to a desired depth. Accordingly, the base region 12 is previously formed on the surface 11s of the drift layer 11.

Subsequently, an n type impurity ($P^+$, $As^+$ or the like) having a concentration higher than a concentration of the p type impurity in the base region 12 is injected into the surface 12s of the base region 12 from the surface 12s of the base region 12 to a desired depth. Accordingly, the source region 13 is formed on the surface 12s of the base region 12.

Figure 7B:
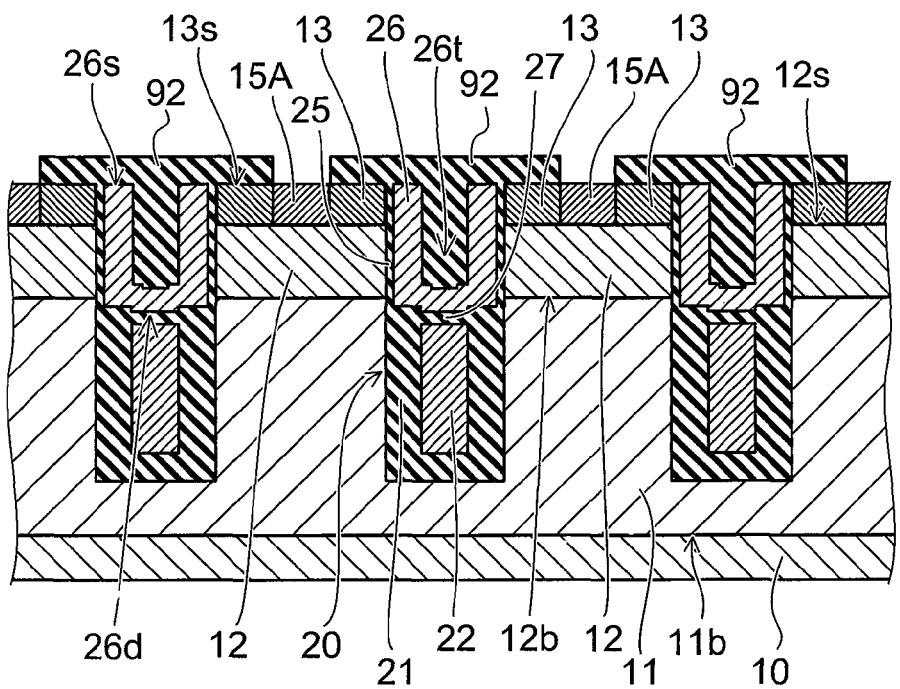

Next, as shown in FIG. 7B, after forming a mask 92, which selectively opens the source region 13, by a photolithography technique, a reactive ion etching or the like, the contact region 15A is formed in the surface 12s of the base region 12.

For example, the p type impurity ($B^+$, $BF_2^+$ or the like) having a concentration higher than a concentration of the n type impurity in the source region 13 is injected from the surface 13s of the source region 13 to the surface 12s of the base region 12 by an ion injection. Accordingly, the contact region 15A is formed on the surface 12s of the base region 12. Thereafter, in order to activate the impurity injected into the semiconductor layer, and remove a damage caused by the ion injection, a thermal treatment is applied to the base region 12, the source region 13, and the contact region 15A.

As mentioned above, the source region 13 is selectively formed on the surface 12s of the base region 12, and the contact region 15A is selectively formed.

Thereafter, a side face of the mask 92 is etched, and at least a part of the source region 13 is exposed (not shown). The mask 92 is not removed, but is converted to the interlayer insulating film 30 as it is. Subsequently, as shown in FIGS. 1A to 1C, in the back surface 11b of the drift layer 11, the drain electrode 50 electrically connected to the drift layer 11, and the source electrode 51 connected to the source region 13 and the contact region 15A are formed by a sputtering method, a vapor deposition method or the like.

In this case, in FIGS. 1A to 1C and FIG. 7B, the state in which the interlayer insulating film 30 (or the mask 92) is completely buried within the trench 26t of the gate electrode 26 is shown. In the embodiment, even if the trench 26t is not completely buried by the interlayer insulating film 30, an effect mentioned later can be obtained.

Next, a description will be given of the effect of the embodiment. Before describing the effect of the embodiment, a description will be given of a reference example.

Figure 8:
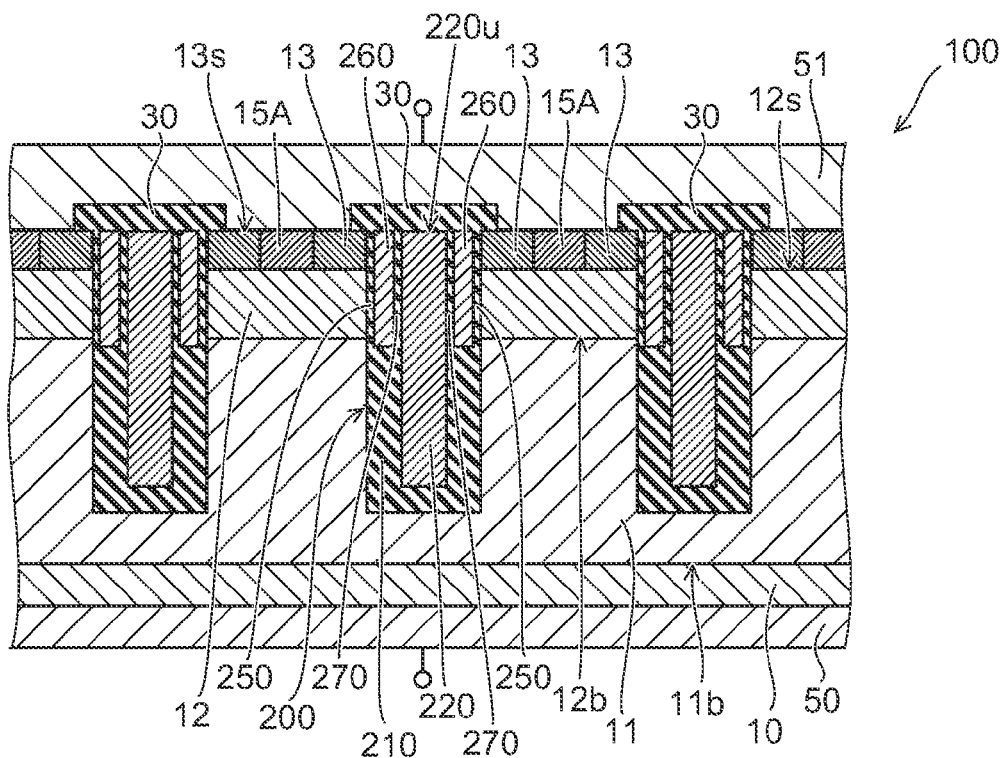
FIG. 8 is a cross-sectional schematic view of a semiconductor device according to the reference example.

FIG. 8 is a cross-sectional schematic view of a semiconductor device according to the reference example.

The semiconductor device 100 according to the reference example is an n channel type MOSFET.

In the semiconductor device 100, a trench 200 is provided. The trench 200 passes through the base region 12 from the surface 13s of the source region 13 and arrives at drift layer 11. Within the trench 200, a gate electrode 260 is extended via a gate insulating film 250 in the direction from the source region 13 toward the drift layer 11. A field plate electrode 220 is extended into the trench 200 via a field plate insulating film 210 in the direction from the source region 13 toward the drift layer 11. The field plate electrode 220 is electrically connected to the source electrode 51.

The semiconductor device 100 has a configuration in which the field plate electrode 220 is pinched by the gate electrode 260. A height of an upper end 220u of the field plate electrode 220 is approximately the same as a height of the surface 13s of the source region 13. An insulating layer 270 is interposed between the field plate electrode 220 and the gate electrode 260. Two insulating layers 270 are provided on both sides of one field plate electrode 220. The insulating layer 270 is extended in the direction from the source region 13 toward the drift layer 11. A length at which the insulating layer 270 extends in the direction from the source region 13 toward the drift layer 11 is longer than a length at which the insulating layer 27, shown in FIGS. 1A to 1C, extends approximately in parallel to the back surface 11b of the drift layer 11. A material of the field plate insulating film 210, the gate insulating film 250 and the insulating layer 270 is, for example, a silicon oxide ($SiO_2$).

Since the field plate electrode 220 is provided, a depletion of the drift layer 11 is promoted in an off state of the semiconductor device 100. Accordingly, the semiconductor device 100 maintains a high breakdown voltage. In the semiconductor device 100, since the depletion of the drift layer 11 is promoted, it is possible to set a concentration of the impurity of the drift layer 11 high. As a result, a resistance of the drift layer 11 is lowered.

However, in the semiconductor device 100, the insulating layer 270 is interposed between the field plate electrode 220 and the gate electrode 260. Accordingly, capacity Cgs between the gate electrode 260 and the source electrode 51 includes a capacity Cgs1 at which the gate insulating film 250 is sandwiched between the gate electrode 260 and the source electrode 51 via the base region 12 and the source region 13, and a capacity Cgs2 at which the insulating layer 270 is sandwiched between the gate electrode 26 and the field plate electrode 220. That is, capacity Cgs includes the capacity Cgs1 and the capacity Cgs2.

In the semiconductor device 100, a length at which the insulating layer 270 extends in the direction from the source region 13 toward the drift layer 11 is longer than a length at which the insulating layer 27 extends approximately in parallel to the back surface 11b of the drift layer 11. Accordingly, the capacity Cgs2 of the semiconductor device 100 becomes larger than the capacity Cgs2 of the semiconductor device 1. In this case, the capacity Cgs2 of the semiconductor device 1 according to the embodiment is the capacity Cgs2 at which the insulating layer 27 is sandwiched between the gate electrode 26 and the field plate electrode 22.

In other words, the capacity Cgs2 of the semiconductor device 1 according to the embodiment is significantly lowered in comparison with the capacity Cgs2 of the semiconductor device 100. Accordingly, in the semiconductor device 1, a switching loss is significantly lowered in comparison with the semiconductor device 100.

The semiconductor device 1 does not have a configuration in which the gate electrode 26 is pinched by the field plate electrode 22. In the semiconductor device 1, the projection portion 26a is provided in the lower portion of the gate electrode 26, and the main face of the projection portion 26a and the upper end 22u of the field plate electrode 22 are opposed via the insulating layer 27. Therefore, in the semiconductor device 1, a substantial area at which the gate electrode 26 and the field plate electrode 22 are opposed is significantly lowered. As a result, the capacity Cgs2 of the semiconductor device 1 is significantly lowered.

Further, in the semiconductor device 1, since the cross section of the gate electrode 26 is the shape which is like the "U" shape, an electric field concentration in the lower end of the gate is relieved. As a result, in the semiconductor device 1, a reliability (an oxide film aged breakage (TDDB), an electrostatic discharge damage (ESD) and a breakage tolerated dose) of the gate insulating film 21 is improved, and a gate leak current is suppressed.

Further, in the semiconductor device 100 of the reference example, since the gate electrode 260 exists between the semiconductor layer and the field plate electrode 220, a volume of the gate electrode 260 becomes smaller than a volume of the gate electrode 26 of the semiconductor device 1.

On the contrary, in the semiconductor device 1 according to the embodiment, it is possible to increase the volume of the gate electrode 26 in comparison with the volume of the gate electrode 260. Accordingly, it is possible to further lower the resistance of the gate electrode 26 in comparison with the resistance of the gate electrode 260.

Further, in the semiconductor device 1 according to the embodiment, the side face of the field plate electrode 22 is covered by the field plate insulating film 21 which is thicker than the thickness of the gate insulating film 25. Accordingly, the semiconductor device 1 includes a high breakdown voltage. For example, in the semiconductor device 1, even if a local electric field is concentrated into the field plate electrode 22, an insulating breakage of the field plate insulating film 21 is hard to be generated.

Further, in the semiconductor device 1, the gate electrode 26 is not completely buried in the trench 20, and the gate electrode 26 is formed in such a manner that the trench 26*t* is formed within the gate electrode 26. In accordance with a method of completely burying the gate electrode 26 in the trench 20, the following problem is generated.

The larger the pitch of the gate electrode 26 is, the more the width of the gate electrode 26 is increased, so that the capacity of the gate electrode 26 becomes necessarily larger. In this case, "width" means a length of each of the members in the direction in which the trench 20 is arranged periodically. Since there is a limitation for the ability of forming a film with the film forming apparatus which forms the gate electrode 26, the larger the capacity of the gate electrode 26 is, the lower a productivity for manufacturing the semiconductor device is Further, the larger the capacity of the gate electrode 26 is, the longer the etching time for etching the gate electrode 26 becomes, so that the thickness of the gate electrode 26 after the etching process tends to be dispersed. Accordingly, the resistance of the gate electrode 26 tends to be dispersed.

On the other hand, the smaller the pitch of the gate electrode 26 is, the higher the aspect ratio of the trench 20 is. Since the gate electrode 26 is configured, as shown in FIG. 5B, such that the gate electrode 26 is grown on the insulating layer 27 and the above of the gate insulating film 25, the higher the aspect ratio of the trench 20 is, the more a void tends to be generated in the inner portion of the gate electrode 26. If the void is formed in the inner portion of the gate electrode 26, a substantial capacity of the gate electrode 26 becomes smaller, and a resistance of the gate electrode 26 is increased. Since the void is formed in the inner portion of the partial gate electrode 26, the resistance of the gate electrode 26 is dispersed.

On the contrary, in the first embodiment, the gate electrode 26 is not completely buried in the trench 20, and the gate electrode 26 is formed in such a manner that the trench 26*t* exists within the gate electrode 26. In accordance with the method mentioned above, the gate electrode 26 having a more uniform shape can be formed regardless of the pitch of the trench 20. As a result, the resistance of the gate electrode 26 is hard to be dispersed, and a productivity of the semiconductor device is improved.

(Second Embodiment)

Figure 9:
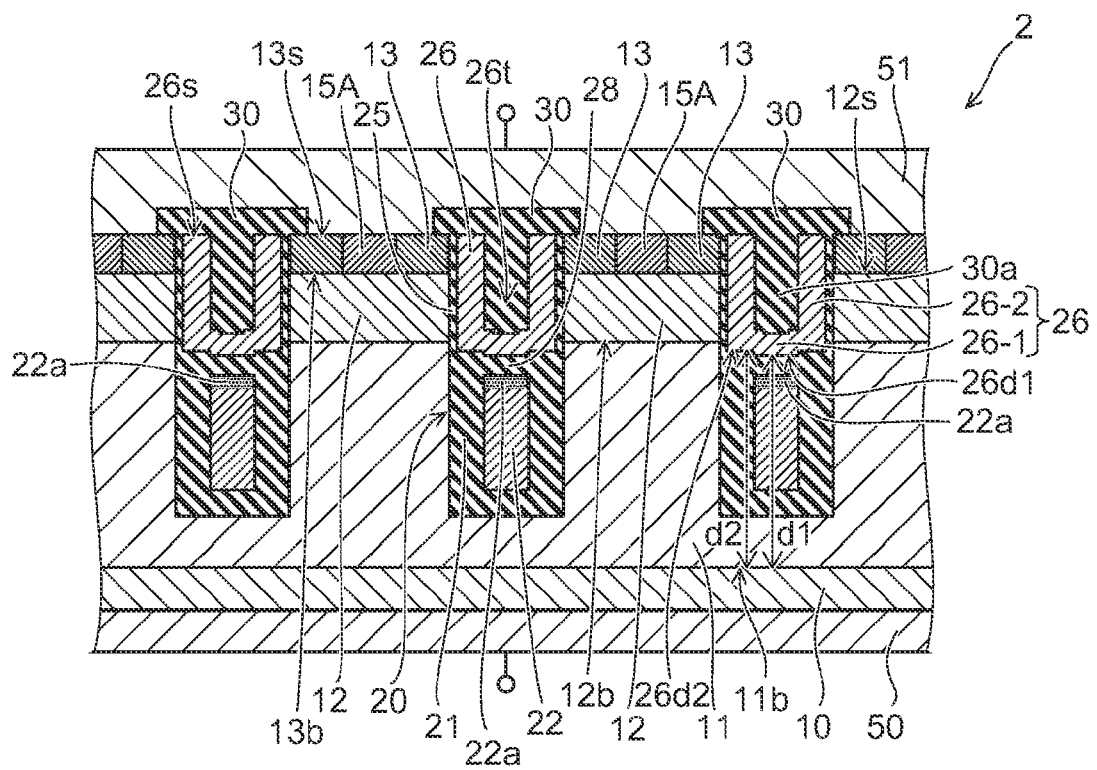
FIG. 9 is a cross-sectional schematic view of a semiconductor device according to a second embodiment.

FIG. 9 is a cross-sectional schematic view of a semiconductor device according to a second embodiment. A cross-sectional schematic view according to FIG. 9 corresponds to a cross-sectional schematic view of a position along a line X-Y in the plan schematic view of FIG. 1A.

A basic configuration of a semiconductor device 2 according to the second embodiment is the same as the semiconductor device 1. For example, in the semiconductor device 2, the distance d1 between the lower end 26*d*1 of the first portion 26-1 of the gate electrode 26 and the back surface 11*b* of the drift layer 11 is shorter than the distance d2 between the lower end 26*d*2 of the second portion 26-2 of the gate electrode 26 and the back surface 11*b* of the drift layer 11. Further, the semiconductor device 2 includes the interlayer insulating film 30 between the source electrode 51 and the gate electrode 26. A part 30*a* of the interlayer insulating film 30 is positioned on a lower side than the upper end (the surface 26*s*) of the gate electrode 26, and the part 30*a* is surrounded by the gate electrode 26.

In this case, in the semiconductor device 2, at least any one of the upper end portion 22*a* of the field plate electrode 22 and the insulating layer 28 on the field plate electrode 22 includes an n type impurity element. In the second embodiment, in order to make the thickness of the insulating layer 28 between the gate electrode 26 and the field plate electrode 22 thicker than the thickness of the insulating layer 27 of the semiconductor device 1, the n type impurity element is included at least in any one of the upper end portion 22*a* of the field plate electrode 22 and the insulating layer 28. Examples of the n type impurity element include, for example, an arsenic (As) or the like.

In the semiconductor device 2, since the thickness of the insulating layer 28 is made thicker than the thickness of the insulating layer 27, the distance between the gate electrode 26 and the field plate electrode 22 is apart in comparison with the semiconductor device 1. Accordingly, the capacity (Cgs2) between the gate electrode 26 and the field plate 22 in the semiconductor device 2 is decreased more than the capacity (Cgs2) between the gate electrode 26 and the field plate electrode 22 in the semiconductor device 1. As a result, in the semiconductor device 2, the switching loss is further reduced in comparison with the semiconductor device 1.

FIGS. 10A to 11B are cross-sectional schematic views for describing a manufacturing process of the semiconductor device according to the second embodiment.

Figure 10A:
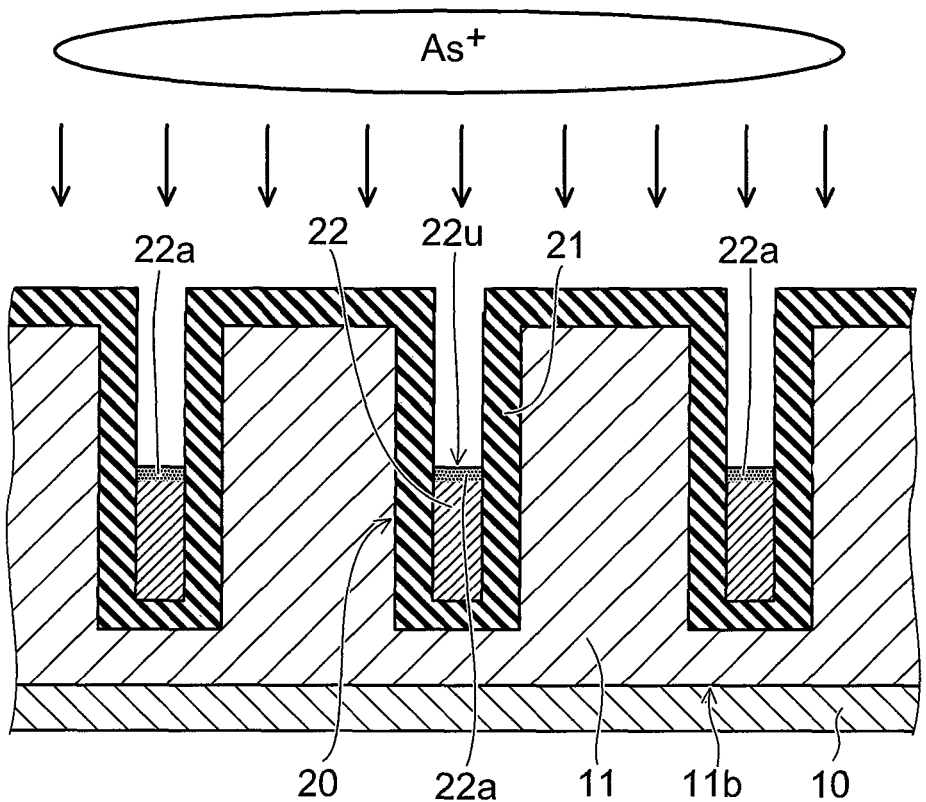
FIGS. 10A to 11B are cross-sectional schematic views for describing a manufacturing process of the semiconductor device according to the second embodiment.

For example, after passing through the same manufacturing process as FIGS. 2A to 3B, the arsenic (As) is selectively injected into the upper end portion 22*a* of the field plate electrode 22, as shown in FIG. 10A. At this time, a surplus portion of the field plate insulating film 21 serves as a mask which shields the arsenic (As). In an ion injection condition, an accelerating energy is between 10 keV and 200 keV, and a dose amount is between $5 \times 10^{14}$ (atoms/cm$^2$) and $5 \times 10^{16}$ (atoms/cm$^2$).

Figure 10B:
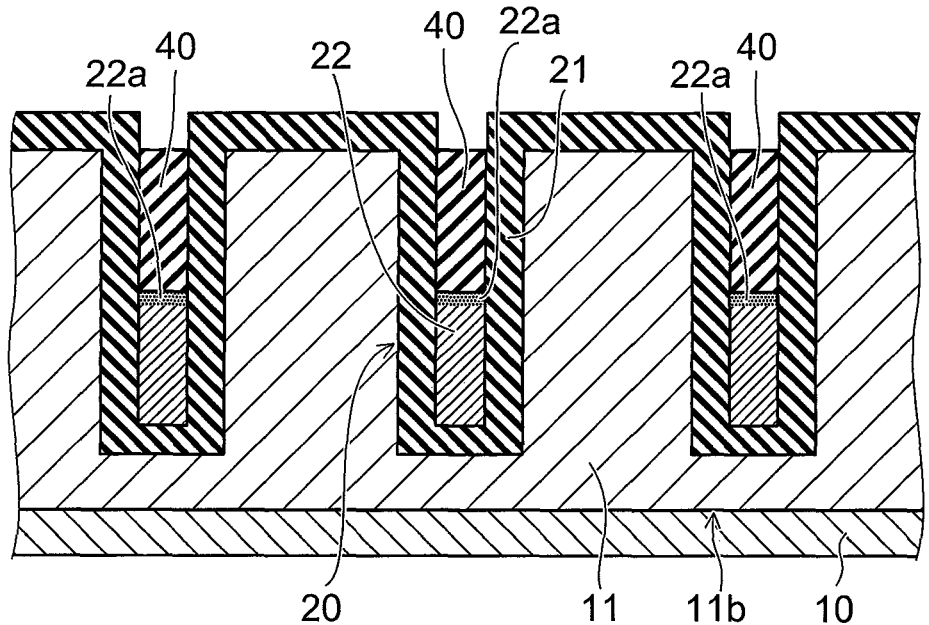

Next, as shown in FIG. 10B, the sacrifice layer 40 is formed on the field plate electrode 22.

Figure 11A:
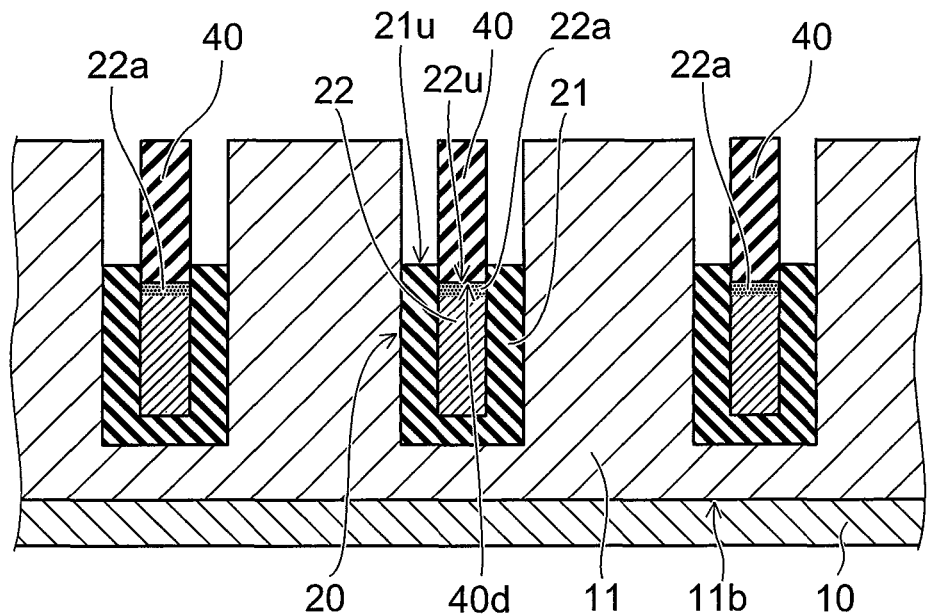

Next, as shown in FIG. 11A, the upper end 21*u* of the field plate insulating film 21 is etched back in such a manner as to prevent the upper end 21*u* of the field plate insulating film 21 from becoming lower than the lower end 40*d* of the sacrifice layer 40.

Figure 11B:
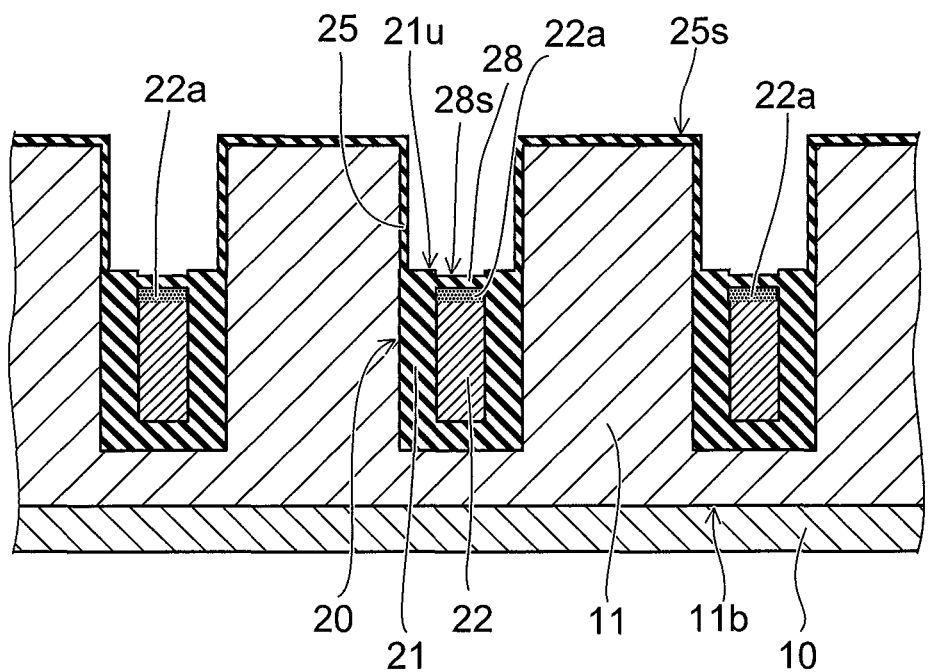

Next, as shown in FIG. 11B, the insulating layer 28 is formed on the field plate electrode 22, and the gate insulating film 25 is formed in the inner wall of the trench 20 on the upper side of the field plate insulating film 21. The insulating layer 28 and the gate insulating film 25 are formed by a thermal oxidation method. The insulating layer 28 and the gate insulating film 25 may be simultaneously formed.

The impurity having a high concentration is included in the upper end portion 22*a* of the field plate electrode 22 before the heat treatment is applied. Accordingly, the thickness of the insulating layer 28 after the heat treatment becomes thicker than the thickness of the insulating layer 27 by a speed increasing oxidation. That is, during the heat treatment, a speed at which the insulating layer 28 grows becomes faster than a speed at which the gate insulating film 25 grows, and the thickness of the insulating layer 28 becomes thicker than the thickness of the insulating layer 27. In this case, the thermal oxidation is carried out by a wet oxidation under a vapor atmosphere at a temperature between 750° C. and 900° C.

Further, in the second embodiment the thickness of the insulating layer 28 is adjusted in such a manner as to become thinner than the thickness of the field plate insulating film 21. Accordingly, the upper end 21*u* of the field plate insulating film 21 becomes higher than the surface 28*s* of the insulating layer 28. That is, in the second embodiment, the step is generated between the surface 28*s* of the insulating layer 28 and the upper end 21*u* of the field plate insulating film 21. Thereafter, according to the same manufacturing process as FIGS. 5B to 7B, the semiconductor device 2 is formed.

(Third Embodiment)

Figure 12:
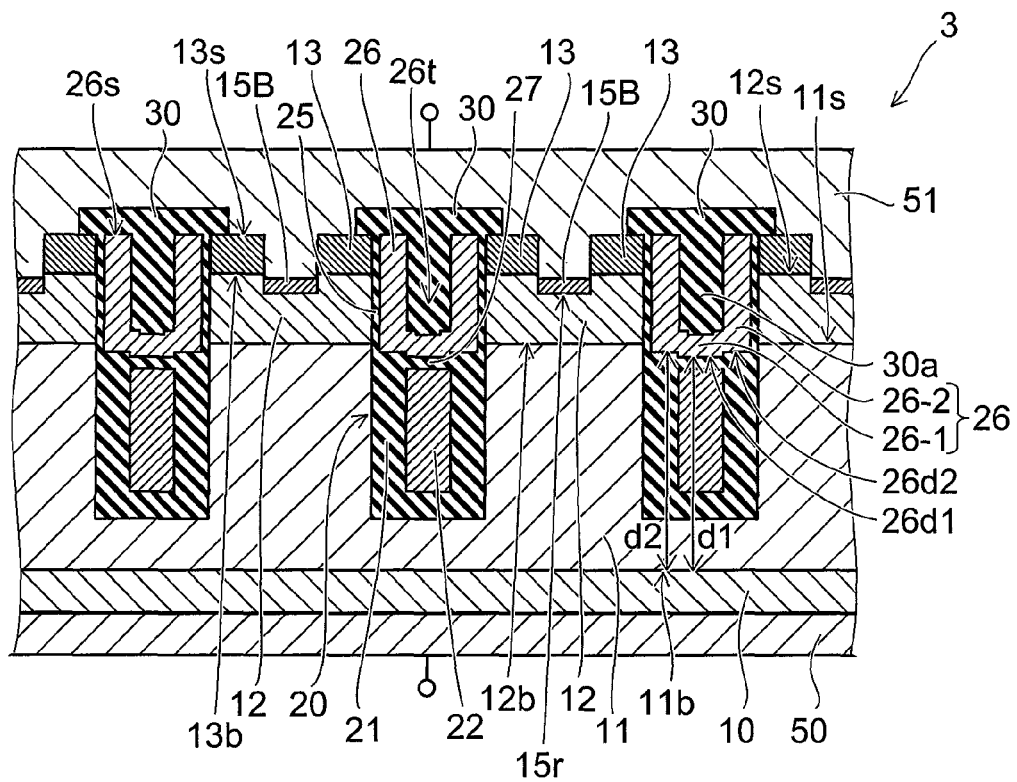
FIG. 12 is a cross-sectional schematic view of semiconductor device according to a third embodiment.

FIG. 12 is a cross-sectional schematic view of a semiconductor device according to a third embodiment. A cross-sectional schematic view according to FIG. 12 corresponds to a cross-sectional schematic view of a position which is along the line X-Y in the plan schematic view of FIG. 1A.

A basic configuration of the semiconductor device 3 according to the third embodiment is the same as the semiconductor device 1. For example, in the semiconductor device 3, the distance d1 between the lower end 26d1 of the first portion 26-1 of the gate electrode 26 and the back surface 11b of the drift layer 11 is shorter than the distance d2 between the lower end 26d2 of the second portion 26-2 of the gate electrode 26 and the back surface 11b of the drift layer 11. In this case, in the semiconductor device 3, a $p^+$ type contact region 15B is selectively provided on the surface 12s of the base region 12. The contact region 15B is provided in a portion in which the base region 12 is recessed by the RIE or the like. The contact region 15B is provided deeper than the base region 12 toward the drift layer 11. That is, a distance between the surface 11s of the drift layer 11 and a lower end 15r (also called as a lower face 15r, or a boundary 15r, or a back surface 15r, or a bottom 15r) of the contact region 15B becomes shorter than the distance between the surface 11s of the drift layer 11 and a lower end 13b (also called as a lower face 13b, or a boundary 13b, or a back surface 13b, or a bottom 13b) of the source region 13.

In accordance with the semiconductor device 3, the contact region 15B comes closer to the drift layer 11 than the contact region 15A. Accordingly, for example, the hole generated in the lower end of the trench 20 tends to be discharged to the source electrode 51 via the contact region 15B. That is, in the semiconductor device 3, an avalanche tolerated dose becomes higher in comparison with the semiconductor device 1.

(Fourth Embodiment)

Figure 13:
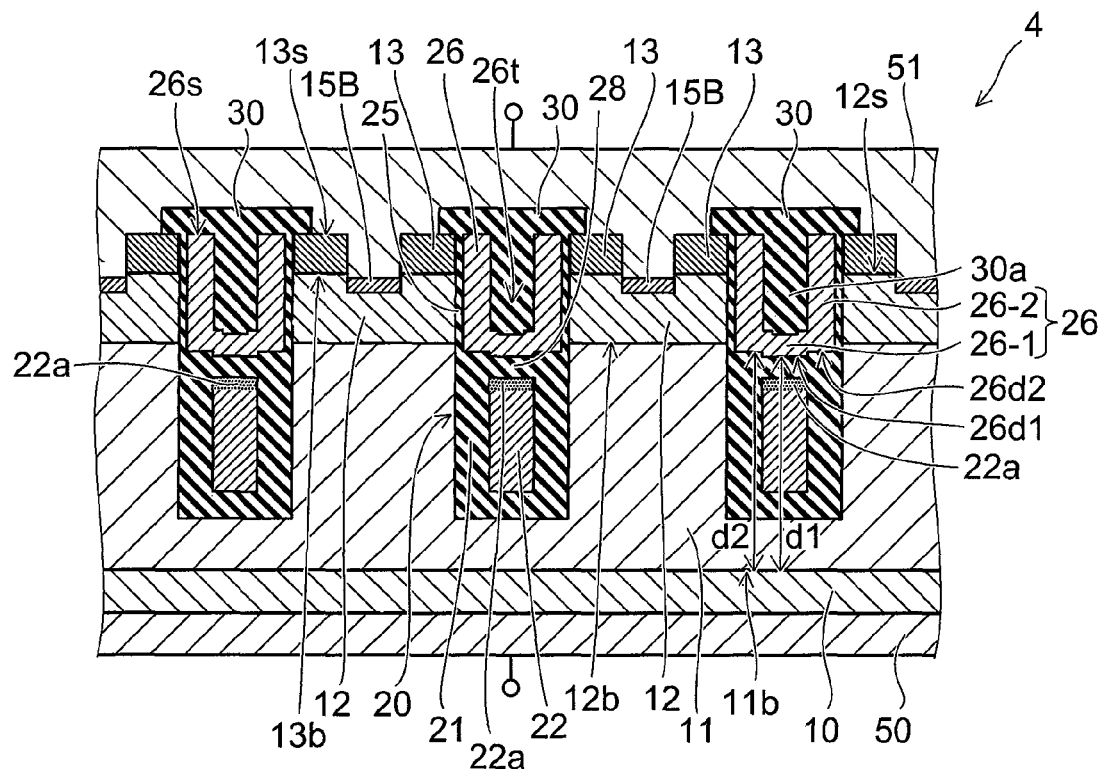
FIG. 13 is a cross-sectional schematic view of a semiconductor device according to a fourth embodiment.

FIG. 13 is a cross-sectional schematic view of a semiconductor device according to a fourth embodiment. The cross-sectional schematic view according to FIG. 13 corresponds to a cross-sectional schematic view of a position which is along the line X-Y in the plan schematic view of FIG. 1A.

The semiconductor device 4 according to the fourth embodiment has a composite configuration of the second embodiment and the third embodiment. For example, in the semiconductor device 4, at least any one of the upper end portion 22a of the field plate electrode 22 and the insulating layer 28 on the field plate electrode 22 includes the n type impurity element. Further, the contact region 15B is provided deeper than the base region 12 toward the drift layer 11. Further, the distance d1 between the lower end 26d1 of the first portion 26-1 of the gate electrode 26 and the back surface 11b of the drift layer 11 is shorter than the distance d2 between the lower end 26d2 of the second portion 26-2 of the gate electrode 26 and the back surface 11b of the drift layer 11. That is, in the semiconductor device 4, the switching loss is further reduced in comparison with the semiconductor device 1, and the avalanche tolerated dose becomes higher in comparison with the semiconductor device 1.

The description is given above of the embodiments with reference to the specific examples. However, the embodiments are not limited to these specific examples. In other words, configurations to which those skilled in the art appropriately apply design changes to these specific examples are included in the scope of the embodiments, as long as they are provided with the features of the embodiments. The arrangement, the material, the condition, the shape, the size and the like of each of the elements provided in each of the specific examples are not limited to the exemplified ones, but can be appropriately changed. For example, the first conductive type may be set to the p type and the second conductive type may be set to the n type. Further, the $p^+$ type semiconductor layer may be provided between the drain layer 10 and the drift layer 11, and the MOSFET shown in FIGS. 1A to 1C may be set to an insulated gate bipolar transistor (IGBT).

Further, each of the elements which are provided in each of the embodiments mentioned above can be combined as long as it can be technically achieved, and the combination is included in the scope of the embodiments as long as it includes the feature of the embodiments. In addition, in the category of the ideas of the embodiments, those skilled in the art can derive various variations and modifications, and it is understood that the variations and the modifications belong to the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first conductive type semiconductor layer;
   a plurality of second conductive type first semiconductor regions provided on the semiconductor layer;
   a first conductive type second semiconductor region provided on each of the plurality of first semiconductor regions;
   a first electrode being positioned between the plurality of first semiconductor regions, the first electrode contacting with the semiconductor layer, each of the plurality of first semiconductor regions, and the second semiconductor region via a first insulating film;
   a second electrode provided below the first electrode, and contacting with the semiconductor layer via a second insulating film;
   an insulating layer interposed between the first electrode and the second electrode;
   a third electrode electrically connected to the semiconductor layer; and
   a fourth electrode connected to the second semiconductor region,
   the first electrode has:
   a first portion facing an upper end of the second electrode; and
   a pair of second portions connected to the first portion, the pair of second portions being extended from the semiconductor layer toward the second semiconductor region, and the pair of second portions facing each other, and
   each of the pair of second portions is provided along the first insulating film.

2. The device according to claim 1, wherein a distance between a lower end of the first portion and a back surface of the semiconductor layer is shorter than a distance between a lower end of the second portion and the back surface of the semiconductor layer.

3. The device according to claim 1, further comprising a second conductive type third semiconductor region on each of the plurality of first semiconductor regions, wherein the fourth electrode is connected to the third semiconductor region.

4. The device according to claim 1, wherein an upper end of the second insulating film is positioned on an upper side than an upper end of the second electrode.

5. The device according to claim 1, wherein a thickness of the second insulating film in a direction in which the plurality of first semiconductor regions are arranged on the semiconductor layer is thicker than a thickness of the first insulating film in a direction in which the plurality of first semiconductor regions are arranged on the semiconductor layer.

6. The device according to claim 1, further comprising an interlayer insulating film between the fourth electrode and the first electrode,
wherein an one part of the interlayer insulating film is positioned on a lower side than an upper end of the first electrode, and the one part is surrounded by the first electrode.

7. The device according to claim 6, wherein the one part of the interlayer insulating film is sandwiched between the pair of second portions.

8. The device according to claim 1, wherein the second electrode is electrically connected to the fourth electrode.

9. The device according to claim 1, wherein at least any one of an upper end portion of the second electrode and the insulating film includes an impurity element of the first conductive type.

10. The device according to claim 9, wherein a distance between a lower end of the first portion and a back surface of the semiconductor layer is shorter than a distance between a lower end of the second portion and the back surface of the semiconductor layer.

11. The device according to claim 10, further comprising an interlayer insulating film between the fourth electrode and the first electrode,
wherein an one part of the interlayer insulating film is positioned on a lower side than an upper end of the first electrode, and the one part is surrounded by the first electrode.

12. The device according to claim 3, wherein the third semiconductor region is provided deeper than the second semiconductor region.

13. The device according to claim 3, wherein a distance between a surface of the semiconductor layer and a lower end of the third semiconductor region is shorter than a distance between the surface of the semiconductor layer and a lower end of the second semiconductor region.

14. The device according to claim 13, wherein at least any one of an upper end portion of the second electrode and the insulating film includes an impurity element of the first conductive type.

15. The device according to claim 14, wherein a distance between a lower end of the first portion and a back surface of the semiconductor layer is shorter than a distance between a lower end of the second portion and the back surface of the semiconductor layer.

16. A semiconductor device comprising:
a semiconductor layer of a first conductive type;
a plurality of first semiconductor regions of a second conductive type disposed on a first surface of the semiconductor layer and spaced from each other in a first direction parallel to the first surface;
a second semiconductor region of the first conductive type provided on each of the plurality of first semiconductor regions;
a first electrode disposed between first semiconductor regions that are adjacent to each other in the first direction, the first electrode contacting the semiconductor layer, each adjacent first semiconductor region, and the second semiconductor region of each adjacent first semiconductor region via a first insulating film;
a second electrode disposed below the first electrode in a second direction orthogonal to the first surface of the semiconductor layer, and contacting the semiconductor layer via a second insulating film;
an insulating layer disposed between the first electrode and the second electrode;
a third electrode electrically connected to the semiconductor layer; and
a fourth electrode electrically connected to the second semiconductor region, wherein
the first electrode has:
a first portion disposed on the insulating layer and facing the second electrode, and
second portions, each connected to the first portion, extending in the second direction from the first portion toward the second semiconductor region, and in contact with the first insulating film, the second portions being separated from each other in the first direction by an insulating material.

17. The semiconductor device of claim 16, further comprising:
a third semiconductor region of the second conductive type separately disposed on each of the first semiconductor regions, wherein the fourth electrode is electrically connected to the third semiconductor region.

18. The semiconductor device of claim 16, wherein a thickness of the second insulating film in the first direction is greater than a thickness of the first insulating film in the first direction.

19. The semiconductor device of claim 16, further comprising:
an interlayer insulating film between the fourth electrode and the first electrode, wherein a part of the interlayer insulating film is the insulating material separating the second portions.

20. The semiconductor device of claim 16, wherein the first electrode has a U-shape when viewed in a direction perpendicular to both the first and second directions.

21. The semiconductor device of claim 16, wherein a distance between the first portion and a second surface of the semiconductor layer that is parallel and opposite to the first surface is less than a distance between each second portion and the second surface.

* * * * *